United States Patent [19]
Altman

[11] 3,947,103
[45]* Mar. 30, 1976

[54] LOW PROFILE EPISCOPIC PROJECTOR AND OPAQUE MATERIALS THEREFOR

[76] Inventor: Gerald Altman, 41 Westminster Road, Newton, Mass. 02159

[ * ] Notice: The portion of the term of this patent subsequent to Oct. 28, 1992, has been disclaimed.

[22] Filed: Aug. 26, 1974

[21] Appl. No.: 500,322

Related U.S. Application Data

[63] Continuation-in-part of Ser. Nos. 329,574, Feb. 5, 1973, Pat. No. 3,837,739, and Ser. No. 419,063, Nov. 26, 1973, which is a continuation-in-part of Ser. No. 81,987, Oct. 19, 1970, Pat. No. 3,778,142.

[52] U.S. Cl. .................... 353/66; 353/44; 353/121; 353/65
[51] Int. Cl.² .......................................... G03B 21/06
[58] Field of Search ........... 353/65, 66, 44, 45, 121, 353/122; 402/20, 27, 5, 6, 35; 281/42, 45–50

[56] References Cited
UNITED STATES PATENTS

| | | |
|---|---|---|
| 2,542,718 | 2/1951 | Snell .............................. 281/45 X |
| 3,249,002 | 5/1966 | Roop ................................. 353/45 |

*Primary Examiner*—Richard E. Aegerter
*Assistant Examiner*—Larry Jones
*Attorney, Agent, or Firm*—Morse, Altman, Oates & Bello

[57] ABSTRACT

The design of a large copy projector is such that its projection path extends rearwardly and obliquely so that the projector and the viewing screen can be viewed side-by-side. This projector uses an opaque copy sheet characterized by a lower specularly reflecting face that is accessible to the optical system from below but that can be marked from above by a chemical reactant ink from a user's pen or the like. Simultaneously, the upper face is unobstructedly available for direct observation and manual access, and the lower face is unobstrusively available for imaging projection through a folded optical path below the copy sheet and a wide angle projection lens positioned at the side of the copy sheet.

24 Claims, 9 Drawing Figures

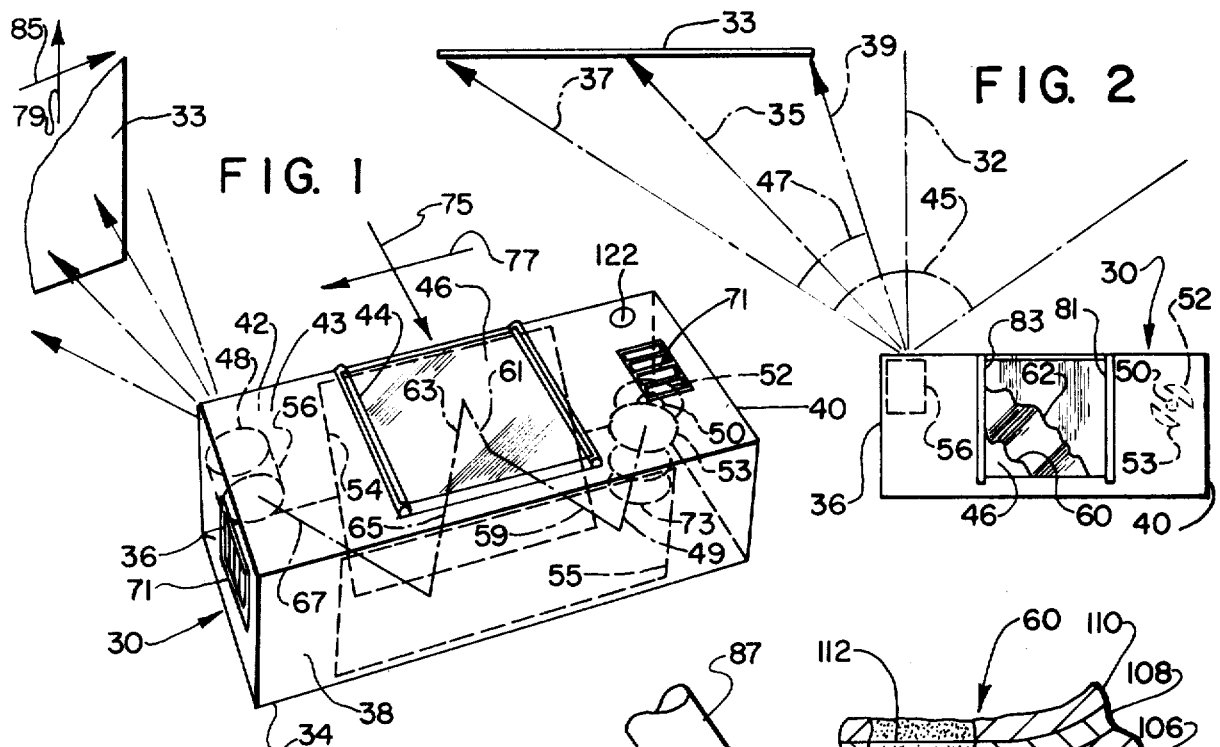
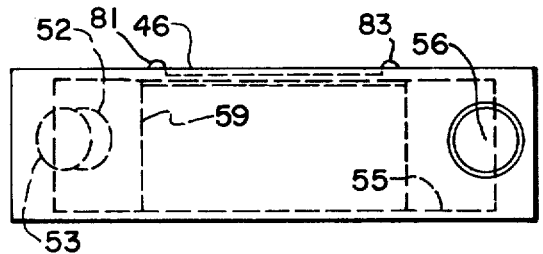
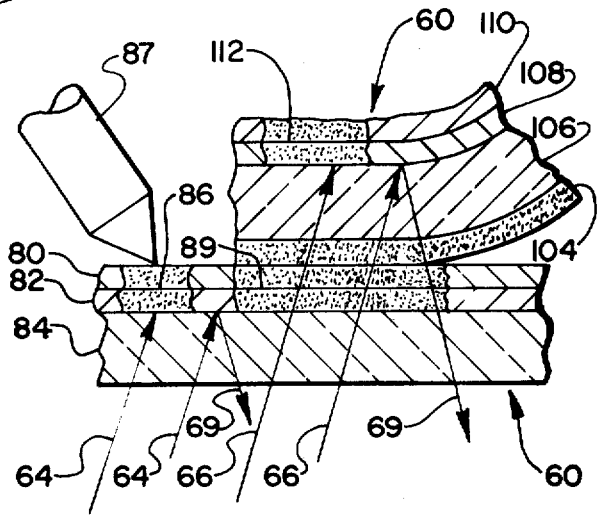
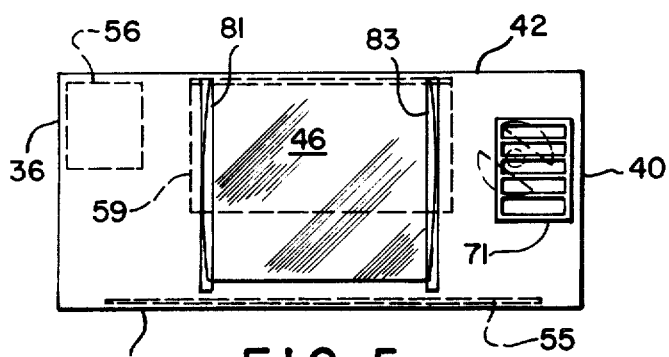
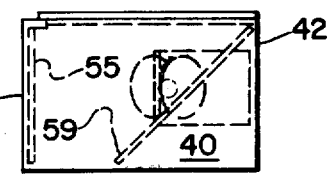

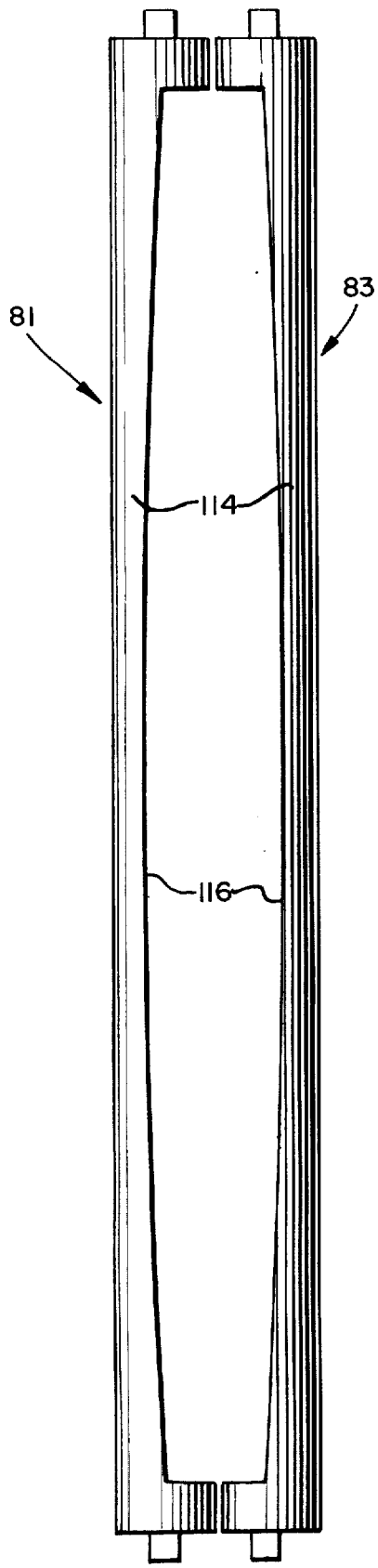
FIG. 7
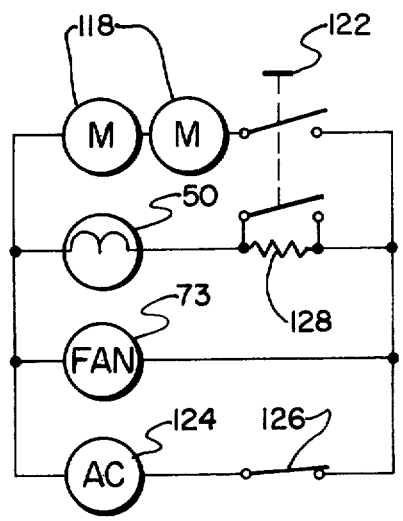
FIG. 8
FIG. 9

LOW PROFILE EPISCOPIC PROJECTOR AND OPAQUE MATERIALS THEREFOR

RELATED APPLICATIONS

The present application is a continuation-in-part of application Ser. No. 329,574, filed Feb. 5, 1973, now U.S. Pat. No. 3,837,739, issued Sept. 24, 1974, and a continuation-in-part of application Ser. No. 419,063, filed Nov. 26, 1973, both the latter two applications, in turn, being continuations-in-part of application Ser. No. 81,987, filed Oct. 19, 1970, now U.S. Pat. No. 3,778,142, issued Dec. 11, 1973.

BACKGROUND AND SUMMARY

The present invention relates to optical imaging and, more particularly, to systems, processes and products involving episcopic imaging, i.e. imaging utilizing light generally reflected from or at a copy sheet or other visual subject, as distinguished from diascopic imaging, i.e. imaging utilizing light generally directed through a copy sheet. The present invention is directed primarily to large copy projectors, exemplified by so-called "overhead" and "opaque" projectors. Diascopic overhead projectors have been characterized by: bulky hardware that obtrudes between the audience and the projected image and causes the operator to assume an unnatural posture in order not to obtrude between the projection lens and the screen; and transparencies that are uncomfortable for the operator to view, handle and store. Episcopic overhead projectors theoretically are more compact than diascopic overhead projectors because illuminating source and imaging lens are at the same side of the copy sheet, whereby vertical dimensions are reduced. But, in practice, episcopic overhead projectors also have been obtrusive because either (1) the light source and imaging lens are positioned by a post in a sizeable casing above the copy sheet or (2) a bulky housing envelops the light paths to and from the copy sheet in order to control glare. Episcopic copy, when composed of paper or sheeting of equivalent appearance, has not been adapted for brilliant imaging because of its optical diffusivity.

The primary object of the present invention is the provision of systems, processes and products involving a portable projector and a copy sheet assemblage that are particularly interrelated to achieve, during projection, direct visual and manual access to the copy sheet by the operator, absolute shielding of the operator and the audience from illuminating light, audience viewing of the projector, together with the operator, and the screen in side-by-side relation, and natural posture of the operator at the projector. The optical projector comprises a low profile housing in which are positioned an upper Fresnel lens underlying the copy sheet, which has its front face upward for direct viewing, a source of illuminating light from which the exterior of the housing is absolutely shielded by the copy sheet itself, and a folded optical path below the Fresnel lens to a wide angle objective lens at the side of the projector. The arrangement is such that an unusually powerful illuminating lamp is practicable. The copy sheet is characterized by a lower reflecting face that is accessible to the optical system from below but that can be marked from above by a chemical reactant ink from a pen which is manually held by an operator. Corrections can be made by a chemical etching patch which can clear sections of the lower reflecting face and present a new reflecting face for marking. Substituting a second copy sheet for a first during projection is achieved by superposing the second upon the first and withdrawing the first from beneath the second so as to maintain a closed optical system.

Other objects of the present invention will in part be obvious and will in part appear hereinafter.

The invention accordingly comprises the systems, processes and products, together with their components, steps, parts and interrelationships, which are exemplified by the present disclosure, the scope of which will be indicated in the appended claims.

BRIEF DESCRIPTION OF DRAWINGS

For a fuller understanding of the nature and objects of the present invention, reference is made to the following detailed description, taken in connection with the accompanying drawings, wherein:

FIG. 1 is a perspective view in use of a large copy projector system embodying the present invention;

FIG. 2 is a top plan view illustrating the side-by-side relation between the projector of the present invention and a viewing screen;

FIG. 3 is an exaggerated cross-sectional view of graphic materials useful in connection with the projector of FIG. 1;

FIG. 4 is a front elevation of the projector of FIG. 1;

FIG. 5 is a top plan view of the projector of FIG. 1;

FIG. 6 is a side elevation of the projector of FIG. 1;

FIG. 7 is a detail view of two components of the projector of FIG. 1;

FIG. 8 is a sequence of broke-away, cross-sectional detail views illustrating the operation of the components of FIG. 7 and associated components; and FIG. 9 is an electrical schematic of the control system of the projector of FIG. 1.

DETAILED DESCRIPTION

A large copy projector embodying the present invention, i.e. for copy greater than 6 × 6 inches in area, is shown in FIG. 1 as including a housing 30, which mounts and contains the operating optical components. As shown, housing 30 is in the form of a sheet metal enclosure having a flat base panel 34, a flat side panel 36, a flat front panel 38, a flat side panel 40, and a rear panel 42. Panel 34 is generally horizontal and panels 36, 38, 40 and 42 are generally vertical. At the top of the housing is a stage 43 having a central opening 44 which encompasses an optically clear, generally horizontal, glass or plastic window 46, the upper face of which is flat and the lower face of which has a Fresnel lens configuration. Rear panel 42 has a projection opening 48. As shown in FIG. 2, side panels 36, 40 are disposed substantially along a viewing axis 32 and projection to a viewing screen 33 occurs along a path having a projection axis 35 and diverging boundaries 37, 39. It will be observed that, with respect to viewing axis 32, screen 33 and projector 30 are viewed by an audience side-by-side.

The optical components include: an illuminating lamp 50, associated with a reflecting spherical mirror 52 and a heat absorbing condensing lens 53, disposed along an illuminating axis 35; a rearward plane mirror 54 generally underlying Fresnel lens 46 along a plane obliquely intesecting the axis of the Fresnel lens; a forward plane mirror 55 generally forward of Fresnel lens 46 in a plane that is generally parallel with respect to the axis of the Fresnel lens, generally perpendicular with respect to viewing axis 32 and oblique with respect to projection axis 35; and a projection lens 56 having an axis that coincides with viewing axis 32. Projection lens has a wide field angle 39, preferably of at least 50°. The arrangement is such that the field angle segment subtended by viewing screen 33 is at most one half of the total field angle. Consequently, since axis 32 is perpendicular to the plane of viewing screen 33, keystoning is avoided. As shown in FIGS. 4, 5 and 6, mirror 54 is greater in maximum transverse dimension than Fresnel lens 46, and mirror 55 is greater in maximum transverse dimension that mirror 54.

As shown in FIG. 1, light is directed from lamp 50 along an illuminating axis segment 49 to mirror 55, is deflected along an illuminating axis segment 59 to rear mirror 54, is deflected along an illuminating axis segment 61 and through Fresnel lens 46 to a specularly reflective copy sheet thereon, and imaging light is returned from the copy sheet through the Fresnel lens along an imaging axis segment 63 to rear mirror 54, along an imaging axis segment 65 to front mirror 55, and is deflected along an imaging axis segment 67 through lens 56 along projection axis 35. It will be understood that, within the projector, the illuminating light diverges along axis segments 49, 59, 61 and the imaging light coverges along axis segments 63, 65, 67. A pair of opposed gripping mechanisms 81, 83, at the edges of Fresnel lens 46, position the copy sheet therebetween in a manner to be described below.

As shown at 60 in FIGS. 2 and 3, an opaque copy sheet, when superposed on Fresnel lens 46, presents an upper face for direct observation and a lower face for imaging by lens 56. As suggested by arrows 64, 64 and 66, 66, light rays emerging upwardly through Fresnel lens 46 are substantially parallel or collimated and light rays 69, 69 returned by reflection from copy sheet 60 are substantially parallel or collimated. A fan 73, together with suitable vents 71, 71, cause cooling air flow through the housing and past the lamp in order to maintain acceptable temperatures at the Fresnel lens and at the lamp. Replacing an initial copy sheet 60 by a new copy sheet 62 merely involves superposing copy sheet 62 upon copy sheet 60 and, while copy sheet 62 is held in place above Fresnel lens 46, withdrawing copy sheet 60 from between copy sheet 62 and Fresnel lens 46. It will be appreciated that projector 30 is capable of projecting transparencies which are interposed between Fresnel lens 46 and a plane cover mirror that can be superposed thereon. In one form (not shown) this cover mirror is hinged to housing 30. From the operator's viewing position, the forward and rightward directions of the copy sheet are indicated at 75, 77. These directions correspond to the upward and rightward directions of the viewing screen indicated at 79, 85.

The graphic product of FIG. 3 is capable of being manually marked to produce, simultaneously, a visual record for direct observation from the front or upper face and for optical projection from the back or lower face in conjunction with the projector of FIG. 1. This product, comprises a base copy sheet which in laminated sequence, comprises: a visual image receiving, diffusely reflecting stratum 80; a visual image receiving, specularly reflecting stratum 82; and an optionally clear, transparent, polymeric support stratum 84. Each of strata 80, 82 ranges in thickness from 500 to 2500 Angstrom units; and stratum 84 ranges in thickness from 3 to 15 mils. In a preferred form, stratum 80 is composed of a metal or metal compound that is light diffusing. Stratum 82 is composed of a specularly reflecting metal in direct contact with stratum 82. It has been found that a special ink 86, which may be applied from a fibrous pen 87, is capable of chemically reacting with strata 80, 82 to leave an etched mark through both strata. As shown, certain of upwardly incident rays 64, 64 are differentially reflected and certain ones are differentially absorbed. In association with the base copy sheet is an erasing patch comprising, in laminated sequence, a diffusely reflecting stratum 110, a specularly reflecting stratum 108, an optically clear transparent, polymeric support stratum 106, and an optically clear pressure sensitive stratum 104, containing a special composition, which is capable of chemically reacting with strata 80, 82 to cause them to clear optically. The cleared region of strata 80, 82 enables transmission of light to and from reflecting stratum 108. The erasing patch itself then may be marked as at 112 so that certain of upwardly incident rays 66, 66 are differentially absorbed and certain ones are differentially reflected. Analagous thickness dimensions of the strata of the patch and the strata of the base sheet correspond to each other respectively. Stratum 104 typically ranges from 0.5 to 5 mils.

In one specific example: support strata 84, 106 are composed of a dimensionally stable polymer, particularly a polyester, polyethylene terephthalate, about 10 mils thick; reflecting strata 82, 108 are composed of aluminum or silver that has been vacuum vapor deposited on support strata 84, 106 in a thickness of about 1200 Angstrom units; visual medium 86, 112 is an etching ink, to be described below, containing an opaque, visible pigment such as carbon; stratum 104 is an etching medium, to be described below, which is optically clear; and strata 80, 110, which are diffusely reflecting, contain a metal or metal salt.

In the foregoing example specifically, ink 86, 112 and stratum 104 contain (1) a polar solute such as water or methyl alcohol, and (2) a soluble salt of a metal that is lower in the electromotive series than the metals of strata 80, 82 and 108, 110, i.e. is characterized by a readiness to acquire electrons from these metals so as to be reduced in a reaction by which these metals are substituted in the salt. Thus with respect to aluminum, such etchant metals include maganese, zinc, chromium, iron, cadmium, cobalt, nickel, tin, lead, copper, bismuth, antimony, mercury, silver, platinum and gold. For example, when strata 80, 110 are composed of zinc or tin and strata 82, 108 are composed of aluminum the salt typically is a halide, for example, cupric chloride.

In the foregoing example specifically, strata 80, 110 are in the form of a metal containing deposit that has been produced either by chemical or electrochemical plating, or by chemical vapor deposition or vacuum vapor deposition. For example, in one form, strata 80, 110 are composed of diffusely reflecting zinc which has been deposited, at room temperature, from an alkaline aqueous, solution of zinc oxide. In another form, strata 80, 110 are composed of diffusely reflecting tin which has been deposited, at room temperature, from an alkaline aqueous solution of sodium or potassium stannate.

As previously suggested, a pair of gripping mechanisms 81, 83 are positioned at opposite sides of Fresnel lens 46 on stage 43. These mechanisms include components that are elongated to extend along the entire side edges of copy sheet 60. As shown in FIGS. 7 and 8 and with reference to FIG. 9, each of these components includes a stationary elongated, elastomeric reference plate 113 and a rotary elongated clamper 114. Each clamper 114 is in the form of an axially journalled roll having a cut-away portion, which presents an inwardly curved clamping edge 116. The rotational positions of clampers 114, 114 are controlled by pair of torque motors 118, 118. When clampers 114, 114 are deactuated, reference plates 113, 113 are free to receive a copy sheet. When actuated, clamping edges 116, 116 abut tightly against the upper faces of reference plates 113, 113 as at 120, 120. The curvatures of clamping edges 116, 116 preclude wrinkling of the copy sheet. The upper surfaces of reference plates 113, 113 are disposed in a plane that is spaced from and above the upper surface of Fresnel lens 46 so as to minimize scratching of the Fresnel lens and to defocus its ridges and grooves. Typically, the spacing between these planes ranges from 0.10 to 0.25 inch. The tension produced across the copy sheet is sufficiently great to enable a user to write on the upper surface of the copy sheet without distorting this surface perceptibly. Preferably the copy sheet is composed of sufficiently high tensile strength material, such as polyethylene terephthalate, to preclude stretching beyond its elastic limit when under high tension and is of sufficient thickness to preclude the formation of wrinkles during generation of the tension. When the copy sheet is so tensioned, it is spaced slightly from Fresnel lens 46. Deenergization of motors 118, 118 permits springs therewithin to return clampers 114, 114 to their original positions so that copy sheet 60 is freed for ready removal.

The electrical control system of the overhead projector of FIG. 1 is shown in FIG. 9 as including torque motors 118, 118, electrical latch-unlatch 122, lamp 50, fan 73, and electrical input 124. Closing of a switch 126 applies power across fan 73, across lamp 60 and a resistor 128 in series, and across the torque motors in series. Lamp 50 thereby is sufficiently energized only to produce a face out condition on the screen, a condition that is desirable while copy sheets are being changed. When button 122 is actuated, resistor 128 is shunted out so that lamp 50 projects brightly and motors 118, 118 are energized. In consequence, edges 116, 116 grip the edges of the copy sheet placed on reference plates 113, 113. A second actuation of clamp-unclamp button 113 causes deenergization of torque motors 118, 118 and a low current through lamp 50.

OPERATION AND CONCLUSION

In operation, first switch 126 is closed to energize fan 73 and to partially energize lamp 50 to fade out condition. Next copy sheet 60 is placed on reference plates 113, 113 and button 122 is actuated to tension the copy sheet in contiguity with Fresnel lens 46 and to fully energize lamp 50 to projection condition. The copy sheet is manually marked to produce, simultaneously, a visual record for direct observation from the front and for optical projection from the back. The result is a visual record that is accessible at the upper face of the copy sheet to the eye of the operator and accessible at the lower face of the copy sheet to the enclosed folded illuminating and projecting optics of the projector for observation on the screen by the audience.

It will be observed that: with respect to front mirror 55, the angle of incidence of axis segment 49 is equal to the angle of reflection of axis segment 67; with respect to rear mirror 54, the angle of incidence of axis segment 59 is equal to the angle of reflection of axis segment 65; with respect to copy sheet 60, the angle of incidence of axis segment 61 is equal to the angle of reflection of axis segment 63. In other words, axis segments 49, 67 are disposed along lines that converge forwardly, axis segments 59, 65 are disposed along lines that converge rearwardly, axis segments 61, 63 are disposed slong lines that converge upwardly. Also, on one side of optical axis 32 of lens 56 is viewing screen 33 and on the other side of optical axis 32 of lens 56 are Fresnel lens 46, copy sheet 60, mirrors 54, 55 and lamp 50. The arrangement is such that the copy sheet and the image of the copy sheet, in the conjugate planes of lens 56, are on opposite sides of the optical axis of the lens. In other words, the operator and the audience see corresponding visual information on the copy sheet and on the viewing screen at the same time and the audience sees the projector in use and the image on the screen side-by-side. Fan 73 remains on at all times switch 126 is closed.

The present invention thus provides a variety of systems involving opaque projection, which ensure: simultaneous, direct optical and mechanical access to the subject by the operator; absolute shielding of the operator and the audience from internal light; no interposition of the optical system between the audience and the screen; and natural posture of the operator at the projector. Since certain changes may be made in the foregoing disclosure, without departing from the scope of the invention hereof, it is intended that all matter described in the foregoing specification and shown in the accompanying drawings, be interpreted in an illustrative and not in a limiting sense.

What is claimed is:

1. A large copy optical projector for imaging a generally horizontal copy sheet on a generally vertical screen spaced from said projector, said copy sheet having an upper face and a lower face and being in association with a specular reflector, said optical projector comprising:
   a. housing means defining an enclosed chamber, said housing means having a forward portion, a rearward portion and a substantially horizontal upper portion, said upper portion having a first opening throughout a major portion of its area, said opening defining the field of said copy sheet;
   b. flat Fresnel lens means at said opening in said upper portion, said Fresnel lens means being substantially coextensive with said opening in said upper portion;
   c. said copy sheet, when in superposed relation with said Fresnel lens means, being substantially coextensive therewith and having substantially the entire upper face of said copy sheet accessible visually and manually to an operator;
   d. said housing means having a second opening, objective lens means at said second opening for receiving imaging light along an imaging path and defining an optical axis;
   e. lamp means in said chamber for directing illuminating light along an illuminating path;
   f. first plane mirror means underlying said Fresnel lens means within said chamber, said first plane mirror means slanting downwardly from said rear portion toward said front portion;
   g. second plane mirror means at said front portion;
   h. said illuminating light diverging in said illuminating path along a first illuminating axis segment communicating with said first plane mirror means and then being reflected along a second illuminating axis segment communicating with said Fresnel lens means;

i. said imaging light reflected from said copy sheet being converged by said Fresnel lens in said imaging path along a first imaging axis segment communicating with said first plane mirror means, next being reflected along a second imaging axis to said second plane mirror, and then being reflected along a third axis segment to said objective lens means;

j. said lamp means and said objective lens means being at opposite edges of said first plane mirror means.

2. The large copy optical projector of claim 1 wherein said second plane mirror means is greater in lateral extent than said first plane mirror means.

3. The large copy optical projector of claim 1 wherein said optical axis of said objective lens means is disposed in a plane that is substantially perpendicular to said second plane mirror means.

4. The large copy optical projector of claim 1 wherein said opposite edges of said first plane mirror means slant downwardly from said rear portion toward said front portion.

5. A large copy optical projector for imaging a generally horizontal copy sheet, said copy sheet having an upper face and a lower face and being in association with a specular reflector, said optical projector comprising:

a. housing means defining as enclosed chamber, said housing means having a forward portion, a rearward portion and a substantially horizontal upper portion, said upper portion having a first opening throughout a major portion of its area, said opening defining the field of said copy sheet;

b. flat Fresnel leans means at said opening in said upper portion, said Fresnel lens means being substantially coextensive with said opening in said upper portion;

c. said copy sheet, when in superposed relation with Fresnel lens means, being substantially coextensive with said opening in said upper portion;

d. said housing means having a second opening, objective lens means at said second opening for receiving imaging light along an imaging path and defining an optical axis;

e. lamp means in said chamber for directing illuminating light along an illuminating path;

f. first plane mirror means underlying said Fresnel leans means within said chamber, said first plane mirror means slanting downwardly from said rear portion toward said front portion;

g. second plane mirror means at said front portion;

h. said illuminating light diverging in said illuminating path along a first illuminating axis segment communicating with said first plane mirror means and then being reflected along a second illuminating axis segment communicating with said Fresnel lens means;

i. said imaging light reflected from said copy sheet being converged by said Fresnel lens means in said imaging path along a first imaging axis segment communicating with said first plane mirror means, next being reflected along a second imaging axis to said second plane mirror, and then being reflected along a third axis segment to said objective lens means;

j. said lamp means and said objective lens means being at opposite edges of said first plane mirror means; and k. viewing screen means generally perpendicular to said optical axis;

l. whereby said housing means and said viewing screen are observed side-by-side without keystoning.

6. The large copy optical projection system of claim 5 wherein said second plane mirror means is greater in lateral extent than said first plane mirror means.

7. The large copy optical projection system of claim 5 wherein said optical axis of said objective lens means is disposed in a plane that is substantially perpendicular to said second plane mirror means.

8. The large copy optical projection system of claim 5 wherein said opposite edges of said first plane mirror means slant downwardly from said rear portion toward said front portion.

9. A large copy projector for imaging a generally horizontal copy sheet on a generally vertical viewing screen spaced from said projector, said copy sheet having an upper face and a lower face and being in association with a specular reflector, said optical projector comprising;

a. housing means defining an enclosed chamber, said housing means having a forward portion, a rearward portion and a substantially horizontal upper portion, said upper portion having a first opening throughout a major portion of its area; said opening defining the field of said copy sheet;

b. a flat Fresnel lens at said opening in said upper portion, said Fresnel lens being substantially coextensive with said opening in said upper portion;

c. said copy sheet, when in superposed relation with said Fresnel lens, being substantially coextensive therewith and having substantially the entire upper face of said copy sheet accessible visually and manually to an operator;

d. said housing means having a second opening, objective lens means at said second opening for receiving imaging light along imaging path and defining an optical axis;

e. lamp means in said chamber for directing illuminating light along an illuminating path;

f. a first plane mirror underlying said Fresnel lens within said chamber, said first plane mirror slanting downwardly from said rear portion toward front portion;

g. a second plane mirror at said front portion;

h. said illuminating light diverging in said illuminating light diverging in said illuminating path along a first illuminating axis segment communicating with said first plane mirror and then being reflected along a second illuminating axis segment communicating with said Fresnel lens;

i. said imaging light reflected from said copy sheet being converged by said Fresnel lens in said imaging path along a first imaging axis segment communicating with said oblique plane mirror, next being reflected along a second imaging axis to said second plane mirror, and then being reflected along a third axis segment to said objective lens means; and j. said objective lens means having a wide field angle including a pair of semi-field angles separated by said optical axis, said field of said copy sheet being substantially encompassed by one of said pair of semi-field angles.

10. A large copy optical projector for imaging a generally horizontal copy sheet on a generally vertical viewing screen spaced from said projector, said copy sheet having an upper face and a lower face and being in association with a specular reflector, said optical projector comprising;
    a. housing means defining an enclosed chamber, said housing means having a forward portion, a rearward portion and a substantially horizontal upper portion, said upper portion having a first opening throughout a major portion of its area; said opening defining the field of said copy sheet;
    b. a flat Fresnel lens at said opening in said upper portion, said Fresnel lens being substantially coextensive with said opening in said upper portion;
    c. said copy sheet, when in soperposed relation with Fresnel lens, being substantially coextensive therewith and having substantially the entire upper face of said copy sheet accessible visually and manually to an operator;
    d. said housing means having a second opening, objective lens means at said second opening for receiving imaging light along an imaging path and defining an optical axis;
    e. lamp means in said chamber for directing illuminating light along an illuminating path;
    f. a first plane mirror underlying said Fresnel lens within said chamber, said first plane mirror slanting downwardly from said rear portion to said front portion;
    g. a second plane mirror at said front portion;
    h. said illuminating light diverging in said illuminating path along a first illuminating axis segment communicating with said first plane mirror and then being reflected along a second illuminating axis segment communicating with said Fresnel lens;
    i. said imaging light reflected from said copy sheet being converged by said Fresnel lens in said imaging path along a first imaging axis segment communicating with said plane mirror, next being reflected along a second imaging axis segment to said second plane mirror, and then being reflected along a third imaging axis segment to said objective lens means;
    j. said objective lens means having an optical axis and a wide field angle including a pair of semi-field angles separated by said optical axis, said field of said copy sheet being substantially encompassed by one of said pair of semi-field angles; and
    k. tensioning means for positioning said copy sheet in superposed relation with said said Fresnel lens, said tensioning means constituting mechanism for gripping said copy sheet at opposite edges of said Fresnel lens.

11. The large copy optical projector of claim 10 wherein said second plane mirror means is greater in lateral extent than said first plane mirror means.

12. The large copy optical projector of claim 10 wherein said optical axis of said objective leans means is disposed in a plane that is substantially perpendicular to said second plane mirror means.

13. The large copy optical projector of claim 10 wherein said opposite edges of said first plane mirror means slant downwardly from said rear portion toward said front portion.

14. The large copy optical projector of claim 10 wherein said objective lens means has an optical axis and a pair of conjugate planes, said Fresnel lens being in one of said conjugate planes on one side of said optical axis, an image of a copy sheet on said Fresnel lens being formed in the other of said conjugate planes on the other side of said optical axis.

15. The large copy optical projector of claim 10 wherein said tensioning means positions said copy sheet a slight distance from said Fresnel lens means.

16. The large copy optical projector of claim 15 wherein tensioning means includes reference surfaces disposed in a plane spaced from the plane of said Fresnel lens means.

17. An optical projector for imaging large copy means and reflecting means in contiguity, said optical projector comprising base means defining a region, Fresnel converging means at an upper position of said region, rearward reflecting means extending obliquely below said Fresnel converging means from an upper and rearward position of said region to a lower and forward position of said region, forward reflecting means at a forward position of said region, illuminating means and objective means at opposed side position of said region, illuminating light being directed from said illuminating means along a first axis segment to said rearward reflecting means and along a second axis segment to said Fresnel converging means, imaging light being directed from said Fresnel coverging means along a third axis segment to said rearward reflecting means, along a foruth axis segment to said forward reflecting means and along a fifth axis segment to said objective means, said first axis segment and said fourth axis segment being disposed along geometric lines that converge rearwardly, said third axis segment and said fourth axis segment being disposed along geometric lines that converge upwardly, said objective means defining an optical axis, said fifth axis segment being disposed along a line that is oblique with respect to said optical axis, and control means associated with said illuminating means and said objective means.

18. The optical projector of claim 17 wherein said control means includes a pair of gripping means on said base means at opposed edges of said Fresnel converging means, said pair of gripping means being operative when actuated to tension said copy means in superposition with respect to said Fresnel converging means and being operative when deactuated to release said copy means from said tension.

19. The optical projector of claim 18 wherein said pair of gripping means includes a pair of reference means, said reference means presenting a pair of surfaces disposed in a first plane, the upper surface of said Fresnel converging means being disposed in a second plane, said first plane and said second plane being spaced from each other.

20. An optical projector for imaging large copy means and reflecting means in contiguity, said optical projector comprising base means defining a region, Fresnel converging means at an upper position of said region, rearward reflecting means extending obliquely below said Fresnel converging means from an upper and rearward position of said region to a lower and forward position of said region, forward reflecting means at a forward position of said region, illuminating means and objective means at opposed side positions of said region, illuminating light being directed from said illuminating means along a first axis segment to said rearward reflecting means and along a second axis segment to said Fresnel converging means, imaging light being directed from said Fresnel converging means along a third axis segment to said rearward reflecting means, along a fourth axis segment to said forward reflecting means and along a fifth axis segment to said objective means, said first axis segment and said fourth axis segment being disposed along geometric lines that converge rearwardly, said third axis segment and said fourth axis segment being disposed along geometric lines that converge upwardly, said objective means defining an optical axis, said fifth axis segment being disposed along a line that is oblique with respect to said optical axis, and control means associated with said illuminating means and said objective means, said control means including a pair of gripping means on said base means at opposed edges of said Fresnel converging means, said pair of gripping means being operative when actuated to tension said copy means in superposition with respect to said Fresnel converging means and being operative when deactuated to release said copy means from said tension, said pair of gripping means including a pair of reference means, said reference means presenting a pair of surfaces disposed in a first plane, the upper surface of said Fresnel converging means being disposed in a second plane, said first plane and said second plane being spaced from each other, said control means including first electrical means for actuating and deactuating said pair of gripping means, second electrical means for energizing and deenergizing said illuminating means, and circuit means for synchronizing said actuating of said pair of gripping means with said energizing of said illuminating means and for synchronizing said deactuating of said pair of gripping means with said deenergizing of said illuminating means.

21. A projector for imaging a specularly reflecting copy sheet on a viewing screen, said projector comprising base means, field lens means on said base means, tensioning means on said base means on opposite sides of said field lens means having actuated and deactuated conditions, said tensioning means when in actuated condition generating tension across said copy sheet in order to position said copy sheet along a predetermined surface, said tensioning means when in deactuated condition releasing said tension across said copy sheet in order to permit its removal and replacement, objective lens means for imaging said copy sheet on said viewing screen, at least one mirror means for folding the optical path between said field lens means and said objective lens means, lamp means having energized and deenergized conditions, said lamp means when energized illuminating said copy sheet sufficiently to cause projection of an image on said viewing screen via said objective lens means, and control means operative in one mode to cause simultaneously said actuated condition of said tensioning means and said energized condition of said lamp means and operative in another mode to cause simultaneously said deactuated condition of said tensioning means and said deenergized condition of said lamp means.

22. A projector for imaging a visual subject on a viewing screen for observation by an audience, said projector comprising:
 a. stage means for supporting said visual subject;
 b. optical converging field means at said stage means having a first axis, a forward portion relatively remote from said screen, a rearward portion relatively adjacent to said screen and a pair of side portions extending between said forward portion and said rearward portion;
 c. lamp means for generating illuminating light along an illuminating path, said illuminating path diverging from said lamp means to said field means;
 d. optical objective means defining a second axis, a pair of partial field angles substantially on opposite sides of said second axis and a pair of conjugate surfaces, said second axis and said first axis being crossed;
 e. reflection of said illuminating light at said visual subject generating imaging light along an imaging path, said imaging path converging from said field means to said objective means and diverging from said objective means to said screen;
 f. first mirror means in said imaging path disposed along a first surface that is oblique with respect to said first axis and said second axis;
 g. second mirror means in said imaging path disposed along a second surface that is oblique with respect to said first surface;
 h. said lamp means and said objective means being on opposite sides of said first axis, sand lamp means being relatively adjacent to one of said side portions of said field means and said objective means being relatively adjacent to the other of said side portions of said field means;
 i. said visual subject when on said stage presenting an upper direct view for observation from above and a lower direct view communicating with said imaging path, said first mirror means, said second mirror means and said objective means generating a projected view on said screen, said projected view corresponding graphically with said upper direct view.

23. A projector for imaging a visual subject on a viewing screen for observation by an audience, said projector comprising:
 a. stage means for supporting said visual subject;
 b. optical converting field means at said stage means having a first axis, a forward portion relatively remote from said screen, a rearward portion relatively adjacent to said screen and a pair of side portions extending between said forward portion and said rearward portion;
 c. lamp means for generating illuminating light along an illuminating path, said illuminating path diverging from said lamp means to said field means;
 d. optical objective means defining a second axis, a pair of partial field angles substantially on opposite sides of said second axis and a pair of conjugate surfaces, said second axis and said first axis being crossed;
 e. stage mirror means for reflecting said illuminating light at said visual subject for generating imaging light along an imaging path, said imaging path converging from said field means to said objective means and diverging from said objective means to said screen;
 f. first deflecting mirror means in said imaging path disposed along a first surface that is oblique with respect to said first axis and said second axis;
 g. second deflecting mirror means in said imaging path disposed along a second surface that is oblique with respect to said first surface;
 h. said lamp means and said objective means being on opposite sides of said first axis, said lamp means being relatively adjacent to one of said side portions of said field means and said objective means being relatively adjacent to the other of said side portions of said field means;

i. said visual subject when on said stage presenting an upper direct view for observation from above and a lower direct view communicating with said imaging path, said first deflecting mirror means said second deflecting mirror means and said objective means generating a projected view on said screen, said projected view corresponding graphically with said upper direct view.

24. A projector for imaging a visual subject on a viewing screen for observation by an audience, said projector comprising:

a. stage means for supporting said visual subject;

b. optical converging field means at said stage means having a first axis, a forward portion relatively remote from said screen, a rearward portion relatively adjacent to said screen and a pair of side portions extending between said forward portion and said rearward portion;

c. lamp means for generating illuminating light along an illuminating path, said illuminating path diverging from said lamp means to said field means;

d. optical objective means defining a second axis, a pair of partial field angles and a pair of conjugate surfaces, said second axis and said first axis being crossed;

e. reflection of said illuminating light at said visual subject generating imaging light along an imaging path, said imaging path converging from said field means to said objective means and diverging from said objective means to said screen;

f. first mirror means in said imaging path disposed along a first surface that is oblique with respect to said first axis and said second axis;

g. second mirror means in said imaging path disposed along a second surface that is oblique with respect to said first surface;

h. said lamp means and said objective means being on opposite sides of said first axis, said lamp means being relatively adjacent to one of said side portions of said field means, and said objective means being relatively adjacent to the other of said side portions of said field means;

i. said visual subject when on said stage presenting a lower direct view communicating with said imaging path such that said first mirror means, said second mirror means and said objective means generate a projected view on said screen, said lower direct view being substantially a mirror image of said projected view.

* * * * *